United States Patent

Rampone et al.

[11] Patent Number: 5,966,020
[45] Date of Patent: Oct. 12, 1999

[54] METHOD AND APPARATUS FOR FACILITATING DETECTION OF SOLDER OPENS OF SMT COMPONENTS

[75] Inventors: Thomas Rampone, Hillsboro; George Arrigotti, Portland, both of Oreg.

[73] Assignee: Intel Corporation, Santa Clara, Calif.

[21] Appl. No.: 08/741,053

[22] Filed: Oct. 30, 1996

[51] Int. Cl.$^6$ ................................................. G01R 31/26
[52] U.S. Cl. ............................................................ 324/755
[58] Field of Search ...................................... 324/755, 754, 324/500, 537, 133, 538, 158.1, 765; 438/14, 17, 765; 439/66–72; 257/40, 48

[56] References Cited

U.S. PATENT DOCUMENTS

| | | | |
|---|---|---|---|
| 2,918,648 | 12/1959 | Ludman et al. | 324/537 |
| 3,016,489 | 1/1962 | Briggs et al. | 324/754 |
| 3,528,104 | 9/1970 | Ehlschlager | 324/538 |
| 4,056,773 | 11/1977 | Sullivan | 324/500 |
| 4,278,508 | 7/1981 | White et al. | 324/158.1 |
| 4,419,626 | 12/1983 | Cedrone et al. | 324/72.5 |
| 4,463,310 | 7/1984 | Whitley | 324/158.1 |
| 4,724,383 | 2/1988 | Hart | 324/158.1 |
| 4,841,240 | 6/1989 | Hsue et al. | 324/133 |
| 5,554,928 | 9/1996 | Stringer | 324/158.1 |
| 5,573,172 | 11/1996 | Gore | 228/180.22 |
| 5,625,297 | 4/1997 | Arnaudov et al. | 324/755 |
| 5,654,646 | 8/1997 | Kit | 324/500 |

*Primary Examiner*—Vinh P. Nguyen
*Attorney, Agent, or Firm*—Blakely, Sokoloff, Taylor & Zafman

[57] ABSTRACT

A split-pad land pattern configured to facilitate electrical testing of an interconnection between a single electrical contact of a surface mount technology component and a printed circuit board. The split-pad land pattern comprises at least one split mounting pad including at least a first and second mounting pads coupled to a single electrical contact. The mounting pads are further coupled to corresponding access pads so that a first access pad is coupled to the first mounting pad while a second access pad is coupled to the second mounting pad. Electrical testing of the single electrical contact is possible through the completed circuit between the two access pads.

26 Claims, 5 Drawing Sheets

ок5,966,020

METHOD AND APPARATUS FOR FACILITATING DETECTION OF SOLDER OPENS OF SMT COMPONENTS

BACKGROUND OF THE INVENTION

1. Field of the Invention

The present invention relates to the field of printed circuit boards. More particularly, the present invention relates to a land pattern architecture used to facilitate more accurate electrical testing of a printed circuit board after its assembly and a corresponding separate electrical contact testing method.

2. Description of Art Related to the Invention

For many years, electronic systems have been designed to include one or more printed circuit board ("PCB"). Each PCB includes a (i) substrate board, being a number of insulation and metal layers selectively patterned to provide metal interconnect lines (referred to herein as "traces"), and (ii) a plurality of components mounted on a surface of the substrate board and interconnected through the traces.

Currently, there are two primary techniques of attaching components to the PCB; namely, through-hole mount technology ("THMT") and surface mount technology ("SMT"). Unlike THMT components in which its leads are inserted into plated holes in the substrate board and soldered in place, SMT components have terminations or leads (generally referred to as "electrical contacts") that are soldered directly to the surface of the substrate board. The driving force behind the use of SMT components involves their reduced package size and assembly simplicity.

The SMT components are attached to the substrate board in accordance to land patterns. A "land pattern" includes a plurality of metalized mounting pads placed on the surface of a substrate board in order to establish electrical connections between a SMT component and at least one trace connected to the mounting pads. The selected orientation of these mounting pads is such that one mounting pad is dedicated to one electrical contact of the SMT component. More specifically, each electrical contact of the SMT component is coupled to a unique mounting pad through a solder joint which is typically formed when the PCB undergoes reflow soldering to attach the SMT components.

After assembly of the PCB, it is necessary to test each solder joint in order to verify that all of the SMT components are properly attached and have proper electrical connections to the PCB. In other words, testing is performed to check for both solder open defects and solder short defects. A "solder open" defect is a condition where there is too little or no solder at an intended solder joint to form a proper connection. A "solder short" defect is a condition where two adjacent electrical contacts, which are not intended to be connected, are connected due to excess application of solder.

Several verification techniques are now being used to determine whether a PCB is defect free. These verification techniques include (i) visual inspection and (ii) electrical testing, both of which may be performed separately or in combination. For visual inspection, a person inspects each side of the PCB with the unaided eye or magnification. For SMT components, defects (especially solder open defects) are difficult to visually detect because most of the solder joint is obstructed from view.

For electrical tests, there are two well-known types of tests; namely, Automated Test Equipment ("ATE") testing and Functional testing. For ATE testing, the PCB is mounted on a test fixture having a number of spring probes. These spring probes establish simultaneous contact with various access pads of the PCB. An "access pad" is an electrical connector to a one or more mounting pads. The access pad is normally located on one or both surfaces of the PCB. By applying a set amount of current into a selected spring probe in contact with a first access pad and measuring current at a second access pad, the solder joints that are disposed on the mounting pads connected to the first and second access pads can be checked for solder open defects and solder close defects. Of course, a completed circuit must be formed between the first access pad and the second access pad in order to perform such measurements. The combination of the land pattern with circuitry used for electrical testing (e.g., is referred to herein as "land pattern circuit".

For Functional tests, the PCB is not connected to specialized test equipment such as ATE test equipment. Rather, it is connected and operated in a similar fashion to how the PCB will be used in an intended electronic system. For example, a PCB acting as a motherboard could be functionally tested by connecting a power supply, a keyboard, a mouse, a monitor, a hard disk drive and a floppy drive. Upon being powered on, the components and solder joints of the PCB are tested during use. The problem is that it is difficult to write a test program that will test every single joint on the PCB during a brief test period. More likely, there would be many potential solder open defects that will go undetected.

It is evident that there are certain components that are more difficult to test for solder open defects than others. For example, electrically isolated SMT components, such as SMT connective components (e.g., sockets, headers), are particularly difficult to test for solder open defects as illustrated in FIGS. 1–2. SMT socket 100 includes a receptacle area 105 providing access to a number of electrical contacts $110_1$–$110_n$ ("n" being a positive whole number, n>1) attached to a PCB 120 through surface mount technology. Each electrical contact $110_{11}$–$110_n$ is coupled to PCB 120 through solder joints $111_1$–$111_n$ between electrical contacts $110_1$–$110_n$ and mounting pads $112_1$–$112_n$. The mounting pads $112_1$–$112_n$ have a one-to-one correspondence with electrical contacts $110_1$–$110_n$. Each electrical contact of the SMT socket 100 is electrically isolated from the other electrical contacts so that each solder joints $111_1$, . . . , and $111_n$ cannot be tested separately. Thus, without a SMT component inserted into the receptacle area 105 of the SMT socket 100, a circuit for measuring current propagation is not completed, precluding current propagation as indicated by arrows in FIG. 2.

Currently, there is no conventional technique for electrically testing an empty SMT socket 100 of FIG. 1 because each electrical contact is electrically isolated from every other electrical contact. Therefore, to test the SMT socket 100, a SMT component 180 must be placed within the receptacle area 105 as shown in FIG. 2. Such placement of the SMT component 180 establishes a completed circuit between a pair of electrical contacts. As shown by arrows, the current propagation path originates at a first spring probe 130 and propagates through a first access pad 140, a trace 150, a first mounting pad 160, a first solder joint 170 disposed on the first mounting pad 160, the SMT component 180, a second solder joint 171, a second mounting pad 161, a trace 151, a second access pad 141 and a second spring probe 131. The requirement of implementing a component before electrically testing the SMT socket 100 poses a number of disadvantages.

One disadvantage is that the installation and removal of components in a high volume, low cost production environment increases the overhead costs realized in constructing PCB assemblies (e.g., increased labor costs, decreased production rate, etc.). Another disadvantage is that installation and removal of a component from the SMT socket may damage the socket. The damaged socket would go undetected because removal of the component occurs upon completing electrical testing of the PCB. As a result, a defective PCB may be accidentally installed into an electronic system to be sold to an end user or shipped to the manufacturer of the electronic system to be subsequently returned as defective. A further disadvantage is that installation and removal of components from the SMT socket may damage the component itself. This may cause inaccurate test results for later tested PCB boards as well as increase manufacturing costs due to continued replacement of damaged components or testing of the component before each test.

In view of the foregoing, it would be quite beneficial to develop a land pattern which would enable testing of an interconnection of a single electrical contact at a time. The unique land pattern (referred to herein as a "split-pad land pattern") involves the substitution of a plurality of mounting pads for a single mounting pad previously assigned to each electrical contact and the addition of more access pads connected to the bottom side of the PCB to support the additional mounting pads.

SUMMARY OF THE INVENTION

A split-pad land pattern for facilitating electrical testing of an interconnection between a single electrical contact of a surface mount technology component and a substrate board. The split-pad land pattern comprises a plurality of mounting pads coupled to a single electrical contact of the component. The mounting pads include at least a first mounting pad and a second mounting pad. First and second access pads may be coupled to the first and second mounting pads to provide an electrical connection to test the solder joints associated with the single electrical contact.

BRIEF DESCRIPTION OF THE DRAWINGS

The features and advantages of the present invention will become apparent from the following detailed description of the present invention in which.

DESCRIPTION OF THE PREFERRED EMBODIMENT

The present invention relates to a split-pad land pattern architecture used by at least one SMT component assembled on a printed board circuit to facilitate electrical testing of that SMT component. In the following description, numerous details are set forth to ensure understanding of the present invention. However, it is apparent to one skilled in the art that these specific details are not required to practice the present invention.

Figure 3:
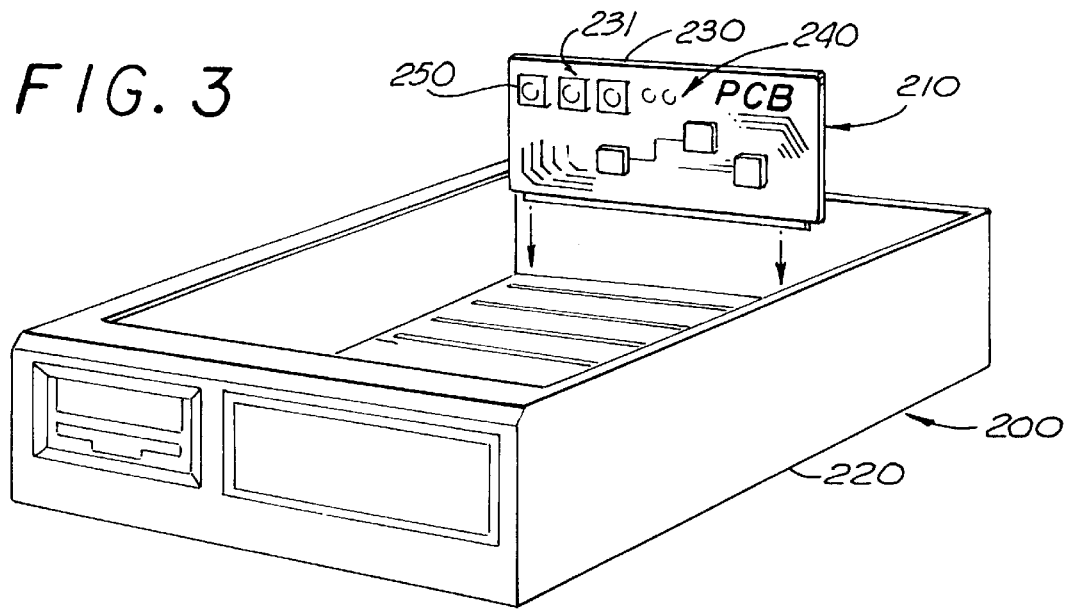
FIG. 3 is a perspective view of an electronic system including at least one PCB that utilizes SMT components coupled to the board through split-pad land patterns.

Referring to FIG. 3, an illustrative embodiment of an electronic system 200, able to utilize the present invention is shown. The electronic system 200 is a product that includes a printed circuit board ("PCB") 210 such a motherboard, peripheral card (e.g., video graphics card, printer card, etc.) or any other type of PCB. Examples of electronic systems include, but are not limited to computers, printers, video recording or playback products and the like. Implemented within a chassis 220 of electronic system 200, the PCB 210 comprises a substrate board 230 including a plurality of surface mount technology ("SMT") components 240 mounted on a surface 231 (e.g., a top surface) of the substrate board 230. These SMT components 240 may include, but are not limited to resistors, capacitors, integrated circuits, batteries, connective components (e.g., sockets, headers, etc.) and the like. In this embodiment, an empty SMT socket 250 is included as one of the SMT components 240 in order to convey that the split-pad land pattern described below enables all types of SMT components, including SMT sockets, to utilize conventional electrical testing techniques.

The implementation of one or more SMT sockets on PCB 210 enables the installation or substitution of components after assembly of PCB 210. More specifically, SMT sockets enable subsequent installation of components that cannot tolerate the reflow soldering or wave soldering during assembly of PCB 210 or are not available when assembling PCB 210. In addition, the SMT sockets enable certain components to be added or substituted to upgrade the electronic system. For example, sockets may be used to provide increased memory capability by the addition of dynamic random access memory ("DRAM") chips to increase main memory size, static random access memory ("SRAM") to provide cache capability, video random access memory ("VRAM") to provide enhanced video capability and the like. It is contemplated that the SMT socket(s) may be configured to receive other types of integrated circuits besides memory chips.

Figure 4A:
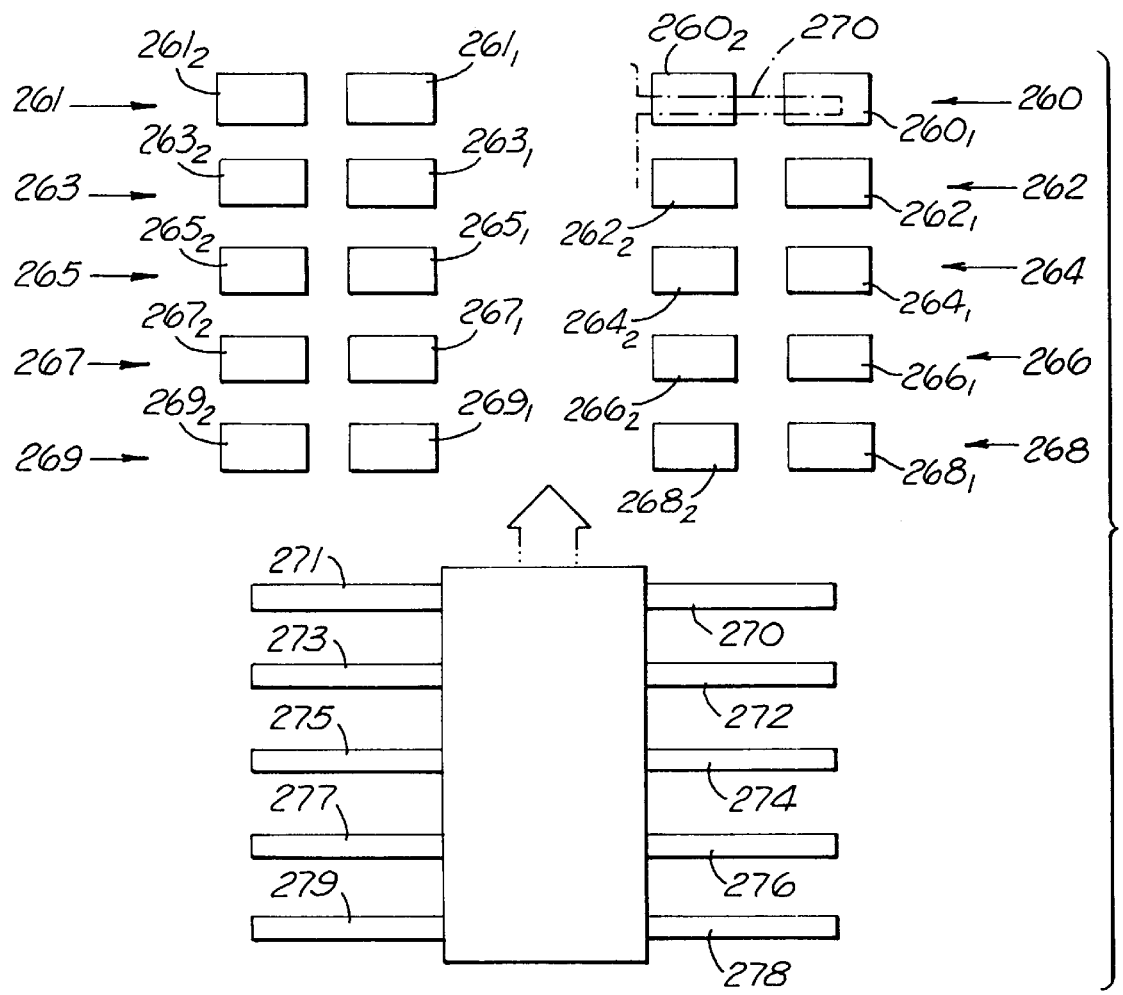
FIG. 4A is a top plan view of a split-pad land pattern utilizing rectangular-shaped mounting pads for a 10-pin SMT component.

Before the SMT components are placed onto the substrate board, the substrate board is prepared by depositing solder paste over land patterns associated with each of the SMT components through screen-printing or stencil printing processes. The solder paste includes microscopic spheres of room-temperature, non-molten solder. One embodiment of a split-pad land pattern used by SMT socket 250 shown as a 10-pin socket is illustrated in FIG. 4A. In this embodiment, a plurality of split mounting pads 260–269 uniquely correspond to each electrical contact 270–279 of the SMT socket 250. These split mounting pads 260–269 are represented in this embodiment as a pair of mounting pads $26x_1$–$26x_2$ ("x"=1 ... 9) although more than two mounting pads may be used. For each split mounting pad, one mounting pad is dedicated only for testing purposes while at least one other may be coupled to a trace for interconnecting other components.

Figure 1:
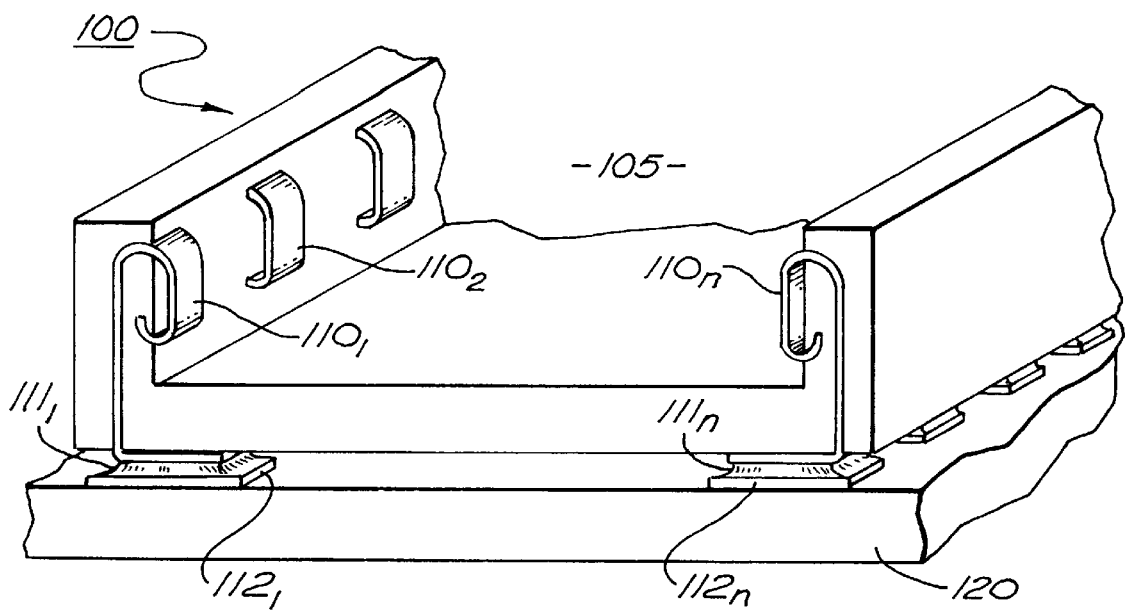
FIG. 1 is a cross-sectional view of a SMT socket prior to placement of a SMT component into a receptacle area of the SMT socket.
Figure 2:
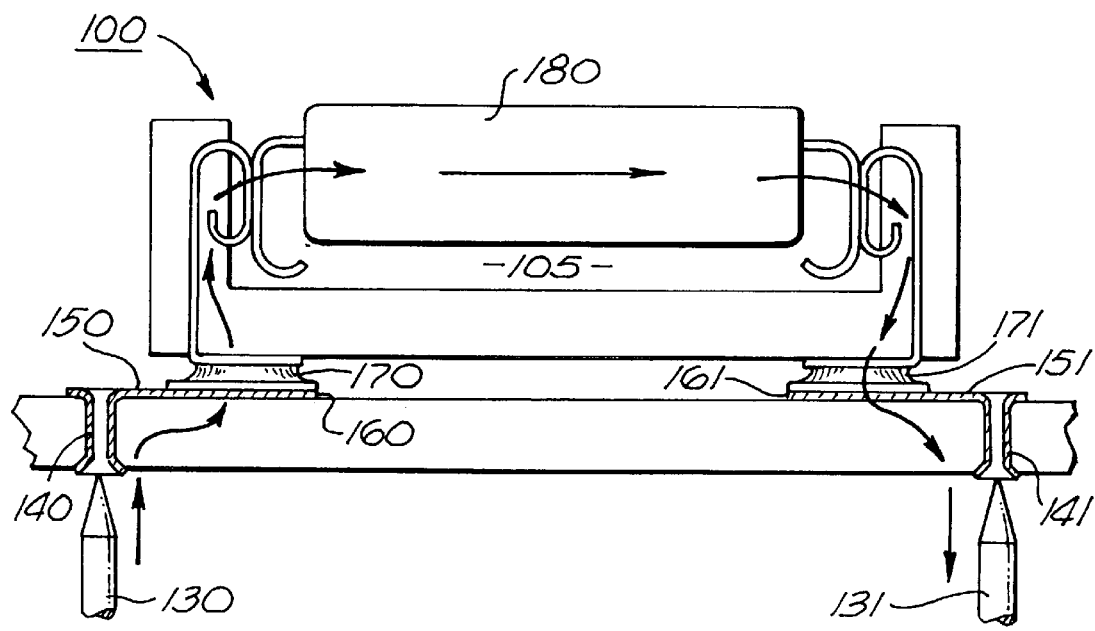
FIG. 2 is a cross-sectional view of the SMT socket of FIG. 1 mounted onto a PCB and implemented with the SMT component into its receptacle area.

Collectively, each split mounting pad 260–269 may be approximate in size to a conventional mounting pad (e.g., pad 160 or pad 161 shown in FIG. 2) having a dimension (width, length) of "x" inches and "y" inches, respectively. Thus, the collective length of the mounting pads and gaps between these pads are "x" inches in width and "y" inches in length. This characteristic is clearly shown in FIG. 4B which illustrates an embodiment of a split-pad land pattern in which only selective electrical contacts of the SMT socket 250, instead of each electrical contact, are placed on split mounting pads (e.g., pads 260, 261, 268 and 269) for attachment. It is clearly contemplated that the split mounting pads may be utilized, solely or in combination with conventional mounting pad schemes, for any land pattern of a component.

Figure 4B:
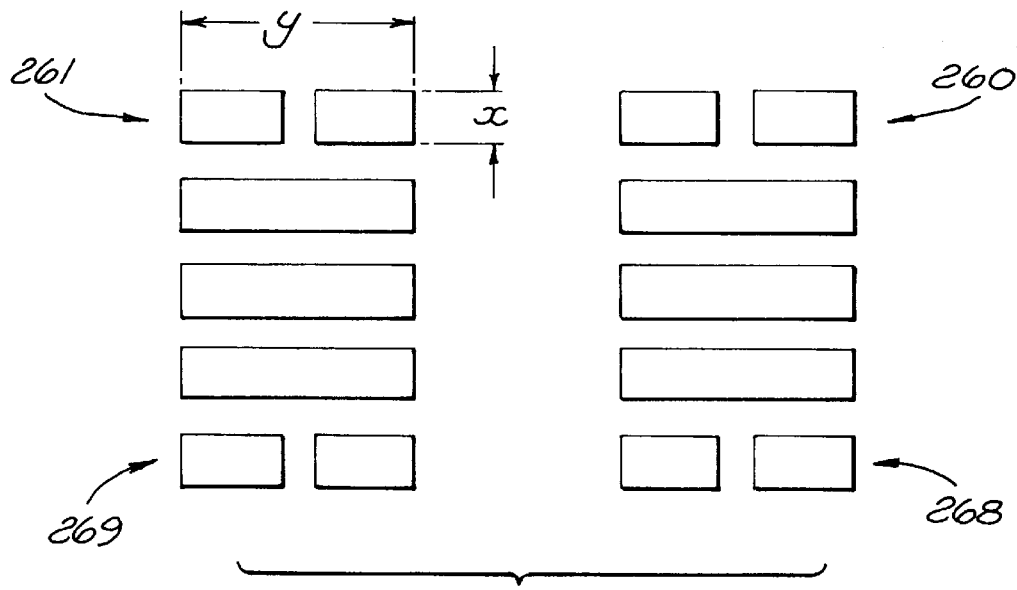
FIG. 4B is a plan view of a SMT component having selective electrical contacts that utilize multiple mounting pads.
Figure 4C:
FIGS. 4C–4G are plan views of various embodiments of the mounting pads associated with a single electrical contact.
Figure 4D:
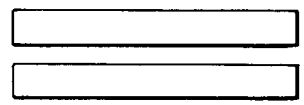
Figure 4E:
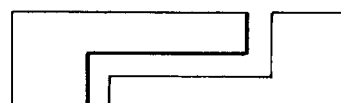
Figure 4F:
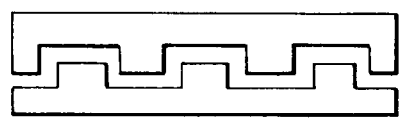
Figure 4G:
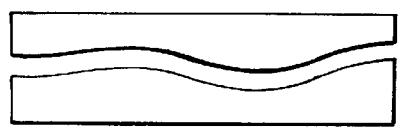

As shown in FIGS. 4A and 4B, the split mounting pads 261–269 are rectangular in shape. It is contemplated, however, that other shapes may be used as shown in FIGS. 4C–4G. These shapes are shown for illustration purposes and the shape utilized by the present invention should not be construed as being limited to only those shapes shown.

After the solder paste is applied, the SMT components are placed onto their reserved split mounting pads. This is typically done with a pick-and-place machine. Although the SMT components are not yet permanently attached, there are held in place temporarily due to the tackiness of the solder paste. After all the SMT components are in place, the PCB undergoes the reflow soldering process. The reflow soldering process involves the use of an oven that heats the entire PCB to a temperature above the melting point of the solder applied to the split mounting pads, generally around 183° Celsius. The microscopic spheres of solder in the solder paste melt and flow together to form a solder joint at each mounting pad of a split mounting pad. After leaving the reflow oven, the solder solidifies, and each lead or termination of each SMT component is both mechanically and electrically connected to each mounting pad.

Figure 5:
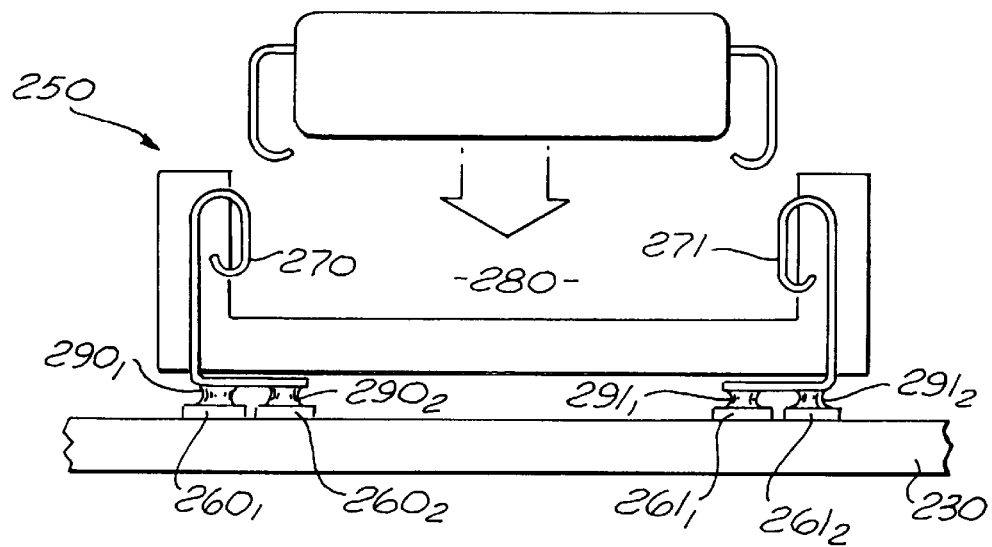
FIG. 5 is a cross-sectional view of a SMT socket utilizing the split-pad land pattern.

Referring to FIG. 5, a cross-sectional view of the SMT socket 250 of FIG. 4A is shown. The SMT socket 250 includes a plurality of electrical contacts in which a first group of electrical contacts 270 and 271 are separated by a receptacle area 280. The electrical contact 270 is interconnected to a first plurality of mounting pads $260_1$ and $260_2$ of the split mounting pad 260 through solder joints $290_1$ and $290_2$, respectively. Similarly, electrical contact 271 is interconnected to a second plurality of mounting pads $261_1$ and $261_2$ of the split mounting pad 261 through solder joints $291_1$ and $291_2$, respectively. Unlike conventional SMT sockets, each solder joint between an electrical contact of the SMT component and the substrate board 230 can be separately checked for solder short defects as well as solder open defects as described in FIG. 6.

Figure 6:
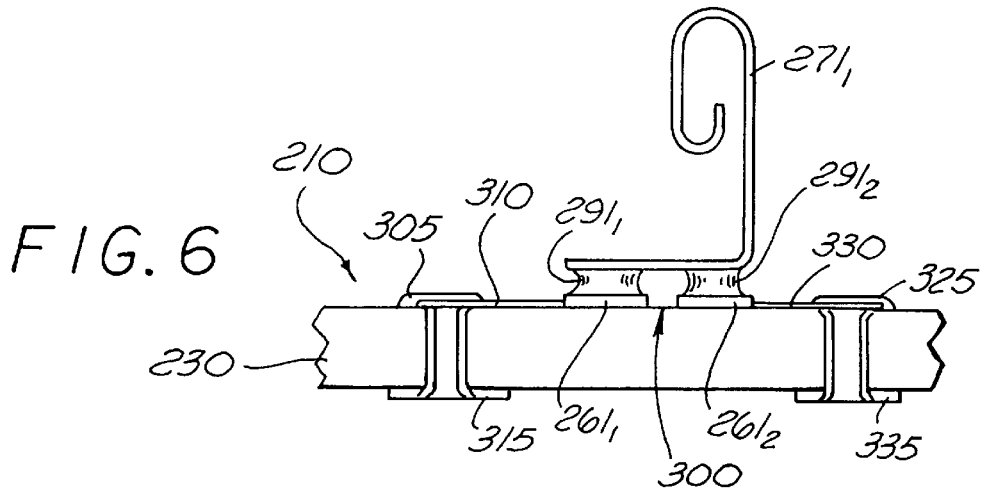
FIG. 6 is a more detailed cross-sectional view of the interconnection of a single electrical contact utilizing the split-pad land pattern.

Referring now to FIG. 6, a more detailed cross-sectional view of the split-pad land pattern architecture for a single electrical contact (e.g., electrical contact 271) of the SMT socket 250 is shown. However, this architecture can be used by any type of SMT component, and thus, should not be construed as being restricted to SMT connective components. As shown, electrical contact 271 is coupled to the split mounting pad 261, namely both a first and second mounting pads $261_1$ and $261_2$ which are separated by a gap 300. The gap 300 is of a sufficient distance, ranging approximately from a couple thousandths of an inch (e.g., 0.005) to fifteen thousandths of an inch or larger, to prevent a solder short defect from occurring between the two mounting pads $261_1$ and $261_2$. These mounting pads $261_1$ and $261_2$ are also electrically coupled to the electrical contact 271 through solder joints $291_1$ and $291_2$, respectively.

As further shown, the first mounting pad $261_1$ is coupled to a first via 305 through a first trace 310. The first "via" 305 is a pre-drilled hole in substrate board 230 that is filled with solder after the soldering process. The first via 305 interconnects the first trace 310 to a first access pad 315 located on the backside of substrate board 230. The first access pad 315 provides an electrical connection from the backside of the substrate board 230 to the first mounting pad $261_1$ of the SMT component. Similarly, the second mounting pad $261_2$ is coupled to a second via 325 as well as other components of PCB 210 through a second trace 330. The second via 325 interconnects the second trace 330 to a second access pad 335 located on the backside of PCB 210 and possibly other components mounted at different locations on PCB 210. It is contemplated, however, that the access pads 315 and 335 may be implemented on the same side of the substrate board 230 instead of on the backside of the PCB 210.

Figure 7:
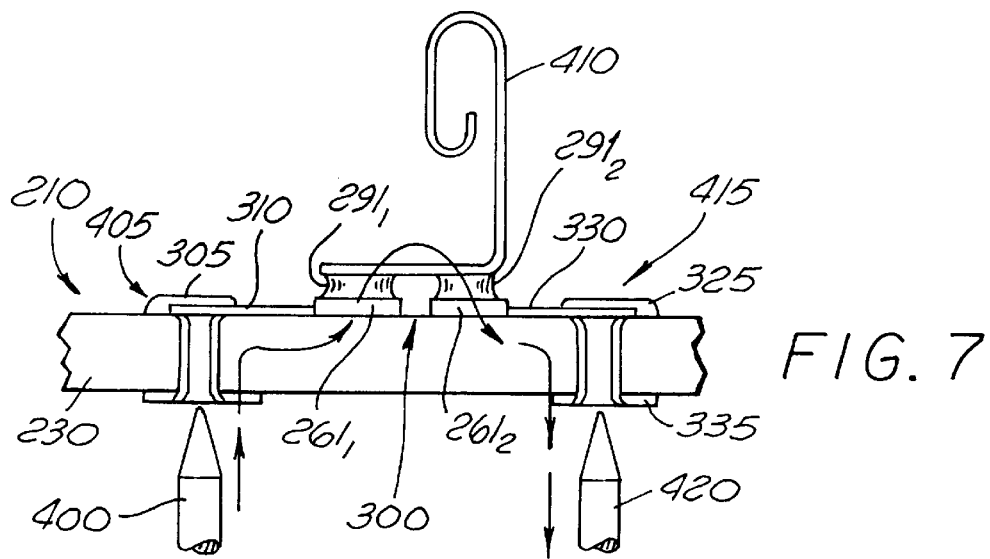
FIG. 7 is a cross-sectional view of the split-pad land pattern associated with a single electrical contact individually subjected to electrical testing.

As shown in FIG. 7, the current propagation path followed by the split-pad land pattern architecture of FIG. 6 is represented by arrows. The split-pad land pattern allows each solder joint to be electrically tested, regardless of the type of SMT component associated with the solder joint. For example, solder joints (e.g., joint $291_2$) of an empty SMT connective component (e.g., socket, header, etc.) may be electrically tested because a completed circuit is established between access pads 315 and 335. As shown, the current propagation path would originate at a first probe 400 and would propagate through the first access pad 305 to a first interconnect 405 including the first via 305 and trace 310. The probe may include a spring probe used in ATE testing, a connector coupled to an ohm meter or a connector of any measuring instrument. Next, current would pass into the electrical contact 410 of the SMT component through a first mounting pad $261_1$ and its solder joint $291_1$. From the electrical contact 410, current would propagate through the solder joint $291_2$ to the second mounting pad $261_2$ also coupled to the electrical contact 410. From the second mounting pad $261_2$, current would propagate through both a second interconnect 415 and the second access pad 335 to a second probe 420 to be measured. If a predetermined amount of current is received by the second probe 420, the electrical contact is properly attached, mechanically and electrically, to the second mounting pad $261_2$.

Figure 8:
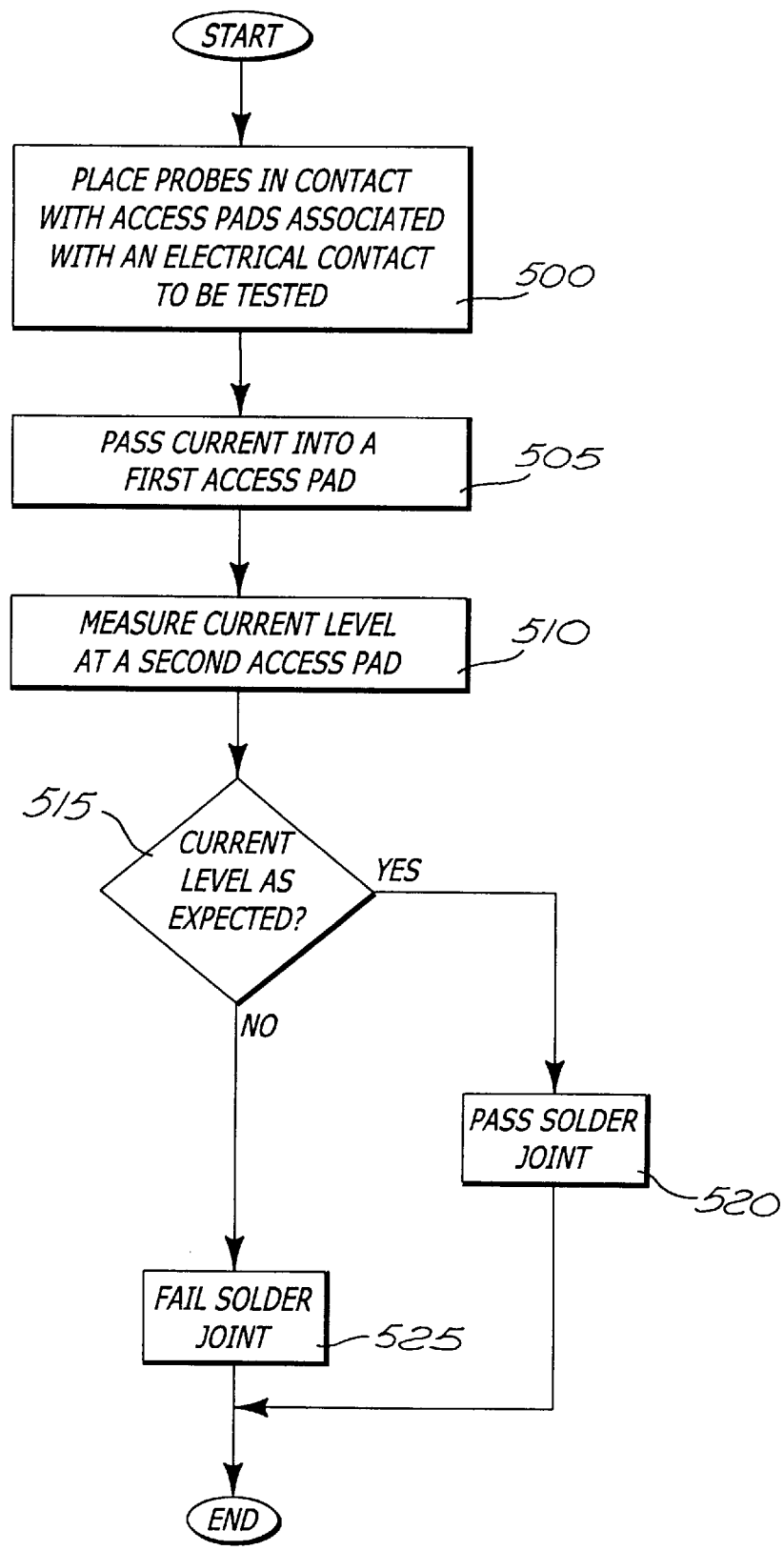
FIG. 8 is a flowchart describing the operations in testing the split-pad land pattern.

As shown in FIG. 8, a flowchart illustrating the operational steps followed to test a SMT component having a split-pad land pattern architecture is shown. First, probes are placed in contact with the access pads uniquely interconnected to a plurality of mounting pads. The mounting pads and access pads correspond to one electrical contact being tested (Step 500). After testing begins, current from the testing device is routed through an access pad to a first mounting pad interconnected to that access pad (Step 505). From there, current is routed through the electrical contact to a second mounting pad and finally to another access pad (Step 510). From there, current measurements may be made to determine if solder joints connecting a SMT component to the mounting pads is devoid of defects (Steps 515–525).

The present invention described herein may be designed in accordance with many different configurations. While the present invention has been described in terms of various embodiments, other embodiments may come to mind to those skilled in the art without departing from the spirit and scope of the present invention. For example, the subject invention may be utilized by component types other than SMT components with electrically isolated contacts. The invention should, therefore, be measured in terms of the claims which follow.

What is claimed is:

1. A land pattern circuit comprising:
   at least one split-mounting pad to be permanently coupled to a single electrical contact of a surface mount technology (SMT) component, the split-mounting pad comprises a plurality of mounting pads including at least a first mounting pad dedicated for testing of the single electrical contact and a second mounting pad to the couple SMT component with another component, the first mounting pad and the second mounting pad are spatially separated from each other.

2. The land pattern circuit according to claim 1 further comprising:
   a first access pad coupled to the first mounting pad; and
   a second access pad coupled to the second mounting pad.

3. The land pattern circuit according to claim 2, wherein said plurality of mounting pads are placed on a first surface of a substrate board.

4. The land pattern circuit according to claim 3, wherein said first and second access pads are placed on a second surface of the substrate board and are electrically coupled to the first and second mounting pads, respectively.

5. The land pattern circuit according to claim 4 further comprising:
   a first trace coupled to the first mounting pad;
   a second trace coupled to the second mounting pad;
   a first via coupled to the first access pad and the first trace; and
   a second via coupled to the second access pad and the second trace.

6. The land pattern circuit according to claim 3, wherein an electrical connection measured between the first access pad and the second access pad indicates that the single electrical contact is properly attached to the plurality of mounting pads placed on the substrate board.

7. The land pattern circuit according to claim 3, wherein said first and second access pads are placed on the first surface of the substrate board and are electrically coupled to the first and second mounting pads, respectively.

8. The land pattern circuit according to claim 1, wherein said plurality of mounting pads are permanently coupled to the single electrical contact through a corresponding plurality of solder joints.

9. The land pattern circuit according to claim 1, wherein said mounting pads are configured adjacent to each other and separated by a distance less than 25 thousandths of an inch.

10. A land pattern circuit that facilitates electrical testing of an interconnection between a single electrical contact of an empty surface mount technology (SMT) socket and a substrate board, comprising:
    access means for receiving a plurality of probes used to perform the electrical testing; and
    split mounting means, being coupled to said access means and the single electrical contact of the empty SMT socket, for electrically coupling the SMT socket to the substrate board and for enabling the interconnection to be individually tested without placement of a SMT component into the SMT socket.

11. The land pattern circuit according to claim 10, wherein said split mounting means being placed on a first surface of the substrate board.

12. The land pattern circuit according to claim 11, wherein said access means being placed on a second surface of the substrate board.

13. The land pattern circuit according to claim 11, wherein said access means being placed on the first surface of the substrate board.

14. The land pattern circuit according to claim 10, wherein said split mounting means includes a plurality of mounting pads coupled to the single electrical contact through a corresponding plurality of solder joints.

15. The land pattern circuit according to claim 10, wherein an electrical connection measured between a first access pad and a second access pad of said access means indicates that the electrical contact is properly attached to the split mounting means of the substrate circuit board.

16. Placed on a substrate board, a split mounting pad that facilitates electrical testing of an interconnection of the substrate board with a single electrical contact of a component, comprising:
    a plurality of mounting pads being made of an electrically conductive material and to be coupled to the single electrical contact upon placement of the component onto the substrate board, said plurality of mounting pads include at least a first mounting pad dedicated for testing of the single electrical contact and a second mounting pad to couple the component with another component on the substrate board, the first and second mounting pads being separated by a gap sufficient in distance to prevent electrical conduction therebetween.

17. A printed circuit board implemented with a surface mount technology component including a plurality of electrical contacts, the printed circuit board comprising:
    a substrate board including a plurality of traces;
    a plurality of split mounting pads disposed on a first surface of the substrate board, a first split mounting pad of the plurality of split mounting pads includes a plurality of mounting pads for coupling with an electrical contact of the electrically-isolated surface mount technology component, said plurality of mounting pads includes at least a first mounting pad and a second mounting pad;
    a first access pad coupled to the first mounting pad through a first trace of the plurality of traces; and
    a second access pad coupled to the second mounting pad through a second trace of the plurality of traces.

18. The printed circuit board according to claim 17, wherein said first and second access pads are placed on a second surface of the printed circuit board and are electrically coupled to the first and second mounting pads, respectively.

19. The printed circuit board according to claim 17, wherein said first and second access pads are placed on the first surface of the printed circuit board and are electrically coupled to the first and second mounting pads, respectively.

20. The printed circuit board according to claim 17, wherein said first and second mounting pads are configured adjacent to each other and separated by a distance less than 25 thousandths of an inch.

21. The printed circuit board according to claim 17, wherein an electrical connection measured between the first access pad and the second access pad indicates that the electrical contact is properly attached to the plurality of mounting pads of the first split mounting pad.

22. A land pattern circuit that facilitates electrical testing of an interconnection between a single electrical contact of an empty surface mount technology (SMT) socket and a substrate board, comprising:
    a plurality of mounting pads being made of an electrically conductive material and to be coupled to the single electrical contact upon placement of the SMT socket onto the substrate board, said plurality of mounting pads include at least a first mounting pad and a second mounting pad being separated from the first mounting pad by a gap sufficient in distance to (i) prevent electrical conduction between the plurality of mounting pads and (ii) enable the interconnection to be individually tested without placement of a SMT component into the SMT socket.

23. Implemented on a substrate board, a land pattern circuit comprising:

a split mounting pad disposed on a first surface of the substrate board, the split mounting pad including a plurality of mounting pads for coupling with an electrical contact of the electrically-isolated surface mount technology component, said plurality of mounting pads includes at least a first mounting pad and a second mounting pad;

a first access pad coupled to the first mounting pad through a first trace; and a second access pad coupled to the second mounting pad through a second trace.

24. The land pattern circuit according to claim 23, wherein said first and second access pads are placed on a second surface of the substrate board and are electrically coupled to the first and second mounting pads, respectively.

25. The land pattern circuit according to claim 23, wherein said first and second access pads are placed on the first surface of the substrate board and are electrically coupled to the first and second mounting pads, respectively.

26. The land pattern circuit according to claim 23, wherein an electrical connection measured between the first access pad and the second access pad indicates that the electrical contact is properly attached to the plurality of mounting pads of the split mounting pad.

* * * * *